(12) United States Patent
Hirai et al.

(10) Patent No.: US 7,787,103 B2
(45) Date of Patent: Aug. 31, 2010

(54) PROJECTION EXPOSURE APPARATUS, OPTICAL MEMBER, AND DEVICE MANUFACTURING METHOD

(75) Inventors: Shinichiro Hirai, Saitama (JP); Yoshinori Ohsaki, Utsunomiya (JP); Yoshiyuki Kuramoto, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 394 days.

(21) Appl. No.: 11/873,724

(22) Filed: Oct. 17, 2007

(65) Prior Publication Data
US 2008/0094597 A1   Apr. 24, 2008

(30) Foreign Application Priority Data
Oct. 24, 2006   (JP)   ............... 2006-289201

(51) Int. Cl.
G03B 27/54 (2006.01)
G03B 27/52 (2006.01)

(52) U.S. Cl. .................................. 355/67; 355/55
(58) Field of Classification Search .................. 355/55, 355/67–71; 356/399–401; 250/548
See application file for complete search history.

(56) References Cited

U.S. PATENT DOCUMENTS

| | | | |
|---|---|---|---|
| 6,614,535 B1 | 9/2003 | Kakuchi et al. | |
| 6,633,362 B2 | 10/2003 | Murakami et al. | |
| 6,661,522 B2 | 12/2003 | Ouchi | |
| 7,095,509 B2 * | 8/2006 | Kakuchi | 356/515 |
| 7,276,717 B2 * | 10/2007 | Kakuchi et al. | 250/548 |
| 2004/0042094 A1 | 3/2004 | Matsuyama | |

FOREIGN PATENT DOCUMENTS

| | | |
|---|---|---|
| JP | 2000-277412 | 10/2000 |
| JP | 2002-013908 | 1/2002 |
| JP | 2002-258131 A | 9/2002 |
| JP | 2005-333149 | 12/2005 |

OTHER PUBLICATIONS

Korean Office Action issued on Jan. 28, 2009 for Korean Patent Application No. 10-2007-0105958 (No English translation provided).

* cited by examiner

*Primary Examiner*—Hung Henry Nguyen
(74) *Attorney, Agent, or Firm*—Rossi, Kimms & McDowell LLP

(57) ABSTRACT

A projection exposure apparatus 100 projects the pattern of an original 6 onto a substrate 7 via a projection optical system PL. The projection exposure apparatus 100 includes an original stage 5 which holds the original 6, a substrate stage 8 which holds the substrate 7, and a measurement unit. The measurement unit includes a Fizeau interferometer IF including an optical unit 17 and mirror 22. The optical unit 17 includes a Fizeau surface which splits a light beam into a reference light beam and a test light beam. The mirror 22 reflects the test light beam having passed through the projection optical system PL. The optical unit 17 is mounted on the original stage 5. The mirror 22 is mounted on the substrate stage 8.

3 Claims, 8 Drawing Sheets

PROJECTION EXPOSURE APPARATUS, OPTICAL MEMBER, AND DEVICE MANUFACTURING METHOD

BACKGROUND OF THE INVENTION

1. Field of the Invention

The present invention relates to a projection exposure apparatus, an optical member built in the same, and a device manufacturing method.

2. Description of the Related Art

Along with an increase in the degree of integration of integrated circuits, it is demanded that a projection exposure apparatus for semiconductor manufacture should project by exposure a circuit pattern formed on a reticle onto the wafer surface with high resolving power. To attain high resolution, the projection exposure apparatus has a projection optical system which increases the NA and shortens the wavelength. A projection exposure apparatus which uses an ArF excimer laser ($\lambda$=193 nm) as a light source so that the NA exceeds 0.8 attains a resolving power of 0.1 µm. In recent years, there has been proposed an immersion exposure apparatus that aims at a finer exposure pattern by filling the space between the wafer and the final surface of the projection optical system with a liquid having a refractive index higher than 1. This proposal is expected to further improve the resolving power.

To manufacture a projection optical system with high resolving power, precision adjustment is necessary after its assembly. That is, the adjustment of the projection optical system includes an operation for improving the specification to have a satisfactory performance by adjusting the interval and decentering of lenses while repeating the optical evaluation of, for example, spherical aberration, coma aberration, and distortion aberration. The optical performance can be evaluated by observing a resist pattern obtained by building the projection optical system in the projection exposure apparatus, projecting a reticle pattern image onto a resist (photosensitive agent) applied to a wafer to form a latent image on it, and developing the latent image.

As described above, the conventional projection exposure apparatus requires checking the quality of the resist pattern to adjust the performance of the projection optical system. However, the resist pattern formation method requires a troublesome operation for causing the projection exposure apparatus to form a latent image pattern on a wafer coated with a resist and develop it, and causing a scanning electron microscope to observe the resist pattern.

It is known to build a Fizeau interferometer in the projection exposure apparatus to measure the wavefront aberration of the projection optical system built in the projection exposure apparatus (Japanese Patent Laid-Open Nos. 2002-013908 and 2005-333149 and Japanese Patent No. 3796369).

To accurately measure the wavefront aberration of the projection optical system, it is necessary to suppress environmental variations such as vibration in the interferometer system to several nm or less. The suppression of such environmental variations requires a length measurement system capable of position measurement on the order of several nm or less, and a driving unit capable of control on the order of several nm using the measurement result. However, mounting of such a high-accuracy, large-scale measurement control system in the projection exposure apparatus has a significant influence on the implementation and cost of the apparatus. To the contrary, it is difficult to suppress environmental variations such as vibration to several nm or less without using such a measurement control system. This makes it impossible to accurately measure wavefront aberration even by building a Fizeau interferometer in the exposure apparatus.

SUMMARY OF THE INVENTION

The present invention has been made in consideration of the above problems, and has as its exemplary object to accurately measure the characteristics (e.g., wavefront aberration) of a projection optical system of a projection exposure apparatus.

The first aspect of the present invention relates to a projection exposure apparatus which projects the pattern of an original onto a substrate via a projection optical system. The projection exposure apparatus includes an original stage which holds the original, a substrate stage which holds the substrate, and a measurement unit. The measurement unit includes a Fizeau interferometer including an optical unit and mirror. The optical unit includes a Fizeau surface which splits a light beam into a reference light beam and a test light beam. The mirror reflects the test light beam having passed through the projection optical system. The optical unit is mounted on the original stage. The mirror is mounted on the substrate stage.

The second aspect of the present invention relates to an optical member mounted on an original stage of a projection exposure apparatus. The optical member includes a first lens and second lens. The first lens has a surface which opposes a projection optical system of the projection exposure apparatus while the first lens is mounted on the original stage. The surface forms the Fizeau surface of a Fizeau interferometer without being coated with any antireflection coating. The second lens has a shape identical to the shape of the first lens and has a surface which opposes the projection optical system while the second lens is mounted on the original stage and is coated with an antireflection coating.

According to the present invention, it is possible to accurately measure the characteristics (e.g., wavefront aberration) of a projection optical system of a projection exposure apparatus.

Further features aspects of the present invention will become apparent from the following description of exemplary embodiments with reference to the attached drawings.

DESCRIPTION OF THE EMBODIMENTS

Preferred embodiments of the present invention will be described below with reference to the accompanying drawings.

Figure 1A:
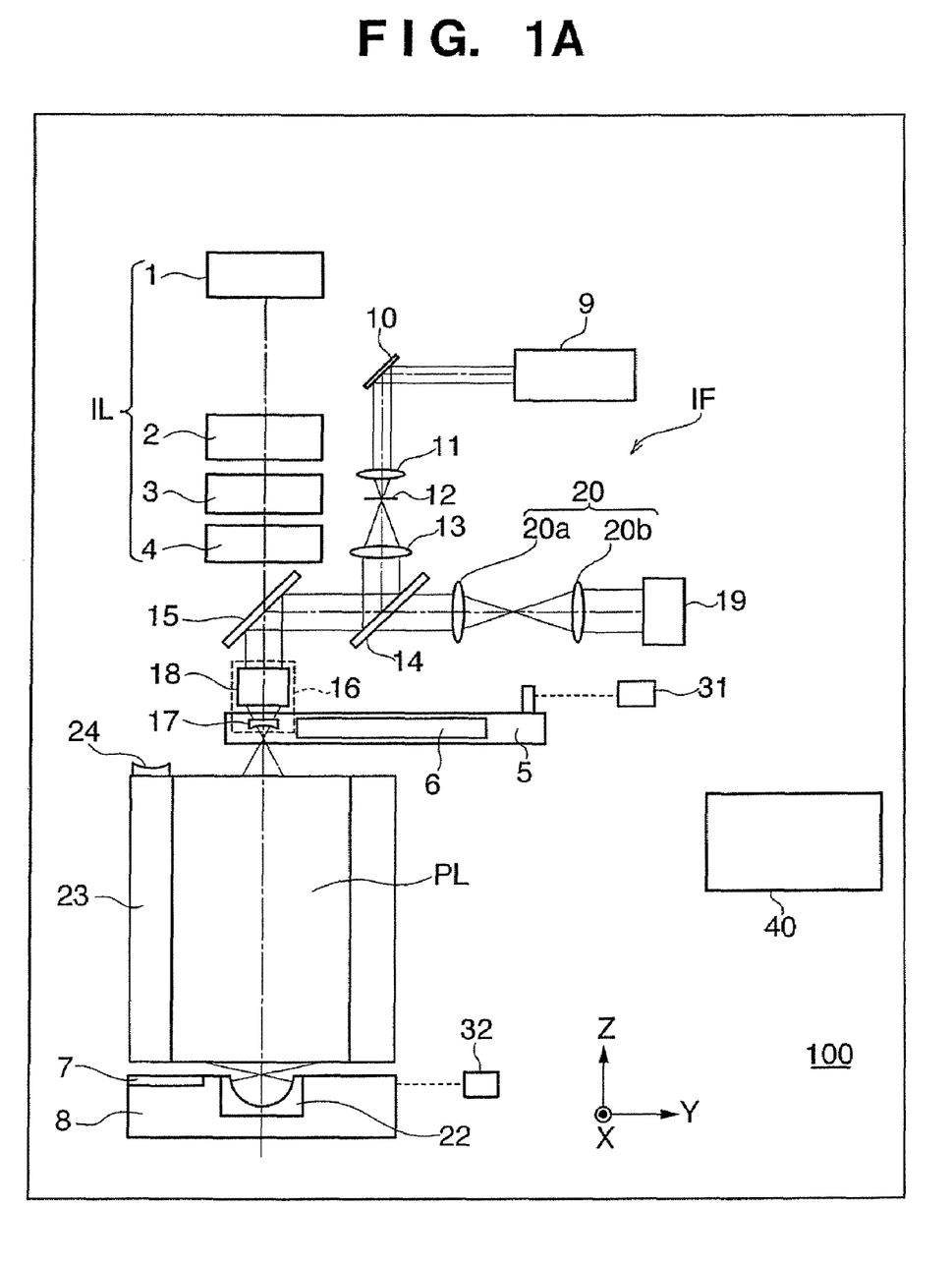
FIGS. 1A and 1B are views showing the schematic arrangement of a projection exposure apparatus according to the first embodiment of the present invention.
Figure 1B:
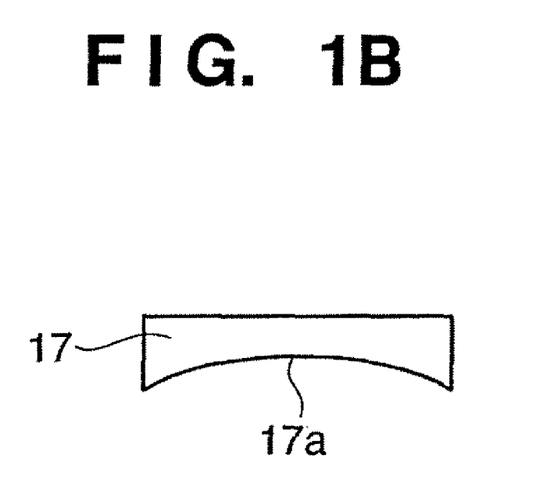

FIGS. 1A and 1B are views showing the schematic arrangement of a projection exposure apparatus according to the first embodiment of the present invention. A projection exposure apparatus 100 shown in FIGS. 1A and 1B is an exemplary scanning projection exposure apparatus to which the present invention is applied. The scanning projection exposure apparatus exposes a wafer (also called a substrate) 7 by scanning it with slit-shaped exposure light, while scanning a reticle (also called an original or mask) 6 and the wafer 7 with respect to a projection optical system PL. A light source which emits exposure light is not limited to a specific one but is preferably, for example, an ArF excimer laser (wavelength: 193 nm) or KrF excimer laser (wavelength: 248 nm). Alternatively, the light source can use, for example, an i-line light source or EUV (Extreme Ultra Violet) light source.

In the following description, directions to indicate operations and arrangements are based on an X-Y-Z orthogonal coordinate system shown in FIG. 1A. In the X-Y-Z orthogonal coordinate system, the X and Y directions are parallel to the wafer 7, and the Z direction is perpendicular to the wafer 7. In general, the X-Y plane is parallel to the horizontal plane, and the Z direction is the vertical direction.

A light beam emitted by an exposure light source (e.g., an ArF excimer laser) 1 is shaped into a beam symmetrical about the optical axis of the projection optical system PL by a beam shaping optical system 2. An incoherent unit 3 shortens the coherence length of the shaped light beam. Via an illumination optical system 4, the light beam illuminates the reticle 6 held by a reticle stage (original stage) 5. The circuit pattern formed on the reticle 6 is projected onto the wafer 7 via the projection optical system PL. A wafer chuck (not shown) arranged on a wafer stage (substrate stage) 8 holds the wafer 7. In this embodiment, the reticle stage 5 is reciprocally driven in at least the Y direction, while the wafer stage 8 is driven in the six axis-directions, that is, the X, Y, and Z directions and the rotational directions about the X, Y, and Z axes. Although not shown, the projection exposure apparatus 100 comprises an alignment detection system and a focus detection system.

A laser interferometer 31 measures the position (e.g., the position in the Y direction) of the reticle stage 5. A laser interferometer 32 measures the position (e.g., the position in the X, Y, and Z directions and the rotation directions about the X, Y, and Z axes) of the wafer stage 8. A control unit 40 synchronously controls the reticle stage 5 and wafer stage 8 on the order of nm based on their positions measured by the laser interferometers 31 and 32.

The projection exposure apparatus 100 comprises a Fizeau interferometer (measurement unit) IF for measuring the wavefront aberration of the projection optical system PL.

In general, if the exposure light source 1 is an excimer laser, the coherence length of a light beam having passed through the incoherent unit 3 is several tens of mm. At the same time, the optical path length of the projection optical system PL as a measurement target is, for example, 1,000 mm or more. It is therefore generally impossible to form a Fizeau interferometer using the light beam having passed through the incoherent unit 3. To cope with this problem, the projection exposure apparatus 100 comprises a dedicated measurement light source 9 that is different from the exposure light source 1 and serves as a light source of an interferometer for measuring the wavefront aberration of the projection optical system PL.

The measurement light source 9 is formed by a laser, and emits light which has a central wavelength that is the same as or extremely close to that of exposure light and has a coherence length of several thousands of mm, which is long enough to measure the wavefront aberration of the projection optical system PL. A light beam emitted by the measurement light source 9 is collimated into a collimated beam by a collimator lens 13 via a mirror 10, condenser lens 11, and pinhole 12. The diameter of the pinhole 12 is set equal to or smaller than that of an airly disk determined by the numerical aperture of the collimator lens 13. For this reason, the light beam emerged from the pinhole 12 becomes an ideal spherical wave. Since the collimator lens 13 is designed to have substantially no aberrations, the collimated beam emerged from the collimator lens 13 becomes an ideal plane wave. In another embodiment, a light beam emitted by the measurement light source 9 can be guided to the pinhole 12 using a polarization-preserving fiber. The collimated beam emerged from the collimator lens 13 enters an objective lens 16 via a half mirror 14 and mirror 15.

The objective lens 16 includes a front objective lens group 17 and rear objective lens group 18. The front objective lens group 17 and rear objective lens group 18 are separate from each other. The front objective lens group 17 is mounted on the reticle stage 5. A "group" such as a "front objective lens group" or "rear objective lens group" means an optical system (optical unit) including one or more lenses.

Of the surfaces of one or more lenses of the front objective lens group 17, a surface 17a opposing the projection optical system PL has the center of curvature that lies in a plane (i.e., the object plane of the projection optical system PL) to set the circuit pattern plane of the reticle 6. This surface will be called a Fizeau surface 17a. The Fizeau surface 17a transmits a certain component of a light beam and reflects the remaining component. Accordingly, a light beam which is incident on the Fizeau surface 17a is split into a reflected light beam and transmitted light beam. A Fizeau surface 17a can be formed without applying any antireflection coating on the surface opposing the projection optical system PL.

The light beam reflected by the Fizeau surface 17a is guided to an image sensor 19 as a reference light beam via the mirror 15, the half mirror 14, and a pupil imaging system 20. The pupil imaging system 20 is an optical system which makes the pupil of the objective lens 16 conjugate to the image sensing surface of the image sensor 19, and can be formed by, for example, lenses 20a and 20b. The light beam transmitted through the Fizeau surface 17a is guided to the projection optical system PL as a test light beam.

The light beam transmitted through the Fizeau surface 17a is imaged at a position in the object plane (i.e., the circuit pattern plane) of the projection optical system PL as a test light beam. After that, the projection optical system PL images the test light beam on a plane (i.e., the image plane of the projection optical system PL) to set the surface of the wafer 7. A spherical mirror 22 is arranged on the wafer stage 8. The center of curvature of the spherical mirror 22 lies in a plane including the image plane of the projection optical system PL. For this reason, the test light beam reflected by the spherical mirror 22 returns to the projection optical system PL after being condensed at a position in the image plane of the projection optical system PL again, and enters the image sensor 19 via the objective lens 16, mirror 15, half mirror 14, and pupil imaging system 20. The test light beam having passed through the projection optical system PL interferes with the reference light beam reflected by the Fizeau surface 17a to form an interference pattern on the image sensing plane of the image sensor 19. The use of this interference pattern allows measurement of the wavefront aberration of the projection optical system PL.

The rear objective lens group 18 and mirror 15 are held by a holding member that can be driven to an arbitrary position in the X and Y directions, and retreat outside the optical path of a light beam emitted by an exposure illumination system IL in exposure. In wavefront aberration measurement, the rear objective lens group 18 and mirror 15 are positioned at the measurement target image height position of the projection optical system PL. Also in wavefront aberration measurement, the reticle stage 5 is driven such that the optical axis of the front objective lens group 17 coincides with those of the rear objective lens group 18 and mirror 15.

If the reticle stage 5 is driven only in the Y direction, a plurality of front objective lens groups 17 are preferably mounted on the reticle stage 5 along the X direction. This makes it possible to measure the wavefront aberration of the projection optical system PL at a plurality of portions in its exposure region. The spherical mirror 22 arranged on the wafer stage 8 is positioned at a position where the front objective lens group 17 is positioned, that is, a position corresponding to the measurement target position of the projection optical system PL.

In the projection exposure apparatus according to this embodiment, the front objective lens group (optical unit) 17 including the Fizeau surface 17a is mounted on the reticle stage 5 by taking advantage of synchronous control between the reticle stage 5 and the wafer stage 8 with a precision as high as, for example, nm order. Since the Fizeau surface 17a that influences the measurement accuracy is precisely positioned, it is possible to accurately measure the wavefront aberration of the projection optical system PL. A separate positioning apparatus may position the optical unit including the Fizeau surface. However, this scheme requires accommodating a separate high-precision positioning apparatus in a narrow space in the projection exposure apparatus and hence is impractical. Still worse, this scheme increases the cost of the projection exposure apparatus.

Figure 2:
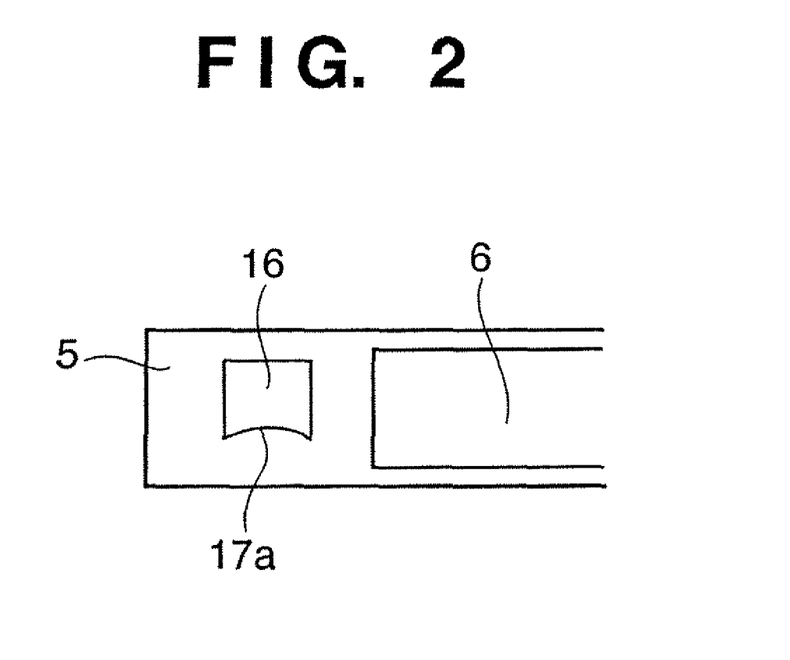
FIG. 2 is a view showing the schematic arrangement of a projection exposure apparatus according to a modification to the first embodiment of the present invention.

In an arrangement shown in FIGS. 1A and 1B, of constituent lenses of the objective lens 16, only the front objective lens group 17 including the Fizeau surface 17a is mounted on the reticle stage 5. However, as illustrated in FIG. 2, the entire objective lens 16 may be mounted on the reticle stage 5. That is, the important thing is to mount a lens including the Fizeau surface 17a on the reticle stage 5. Therefore, the other constituent lenses of the objective lens 16 need not be mounted on the reticle stage 5.

Also in an arrangement shown in FIG. 2, if the reticle stage 5 is driven only in the Y direction, a plurality of objective lenses 16 are preferably arranged on the reticle stage 5 along the X direction. This makes it possible to measure the wavefront aberration of the projection optical system PL at a plurality of portions in its exposure region.

Although FIG. 1A exemplifies a concave spherical mirror as the spherical mirror 22, a convex spherical mirror may be adopted instead. The convex spherical mirror is arranged on the wafer stage 8 such that its center of curvature lies in the image plane of the projection optical system PL. Alternatively, a plane mirror may be adopted instead of the spherical mirror 22. Even in this case, it is possible to measure only a rotational symmetrical component of wavefront aberration.

The wavefront of the Fizeau interferometer IF is preferably measured in advance to distinguish the wavefront error of the Fizeau interferometer IF itself from the wavefront aberration of the projection optical system PL to be measured. Correction by subtracting the wavefront error of the Fizeau interferometer IF from the measurement result of the projection optical system PL makes it possible to precisely calculate the wavefront of the projection optical system PL. More specifically, the wavefront error of the Fizeau interferometer IF itself is measured using a spherical mirror 24 arranged on a barrel 23 holding the projection optical system PL, on the side of the reticle 6. Similar to the Fizeau surface 17a, the center of curvature of the spherical mirror 24 lies in a plane (i.e., the object plane of the projection optical system PL) to set the circuit pattern plane of the reticle 6. The objective lens 16 is horizontally driven onto the spherical mirror 24 so that a test light beam transmitted through the Fizeau surface 17a is reflected by the spherical mirror 24 without entering the projection optical system PL. When this reflected light beam enters the image sensor 19 via the objective lens 16, mirror 15, half mirror 14, and pupil imaging system 20, the wavefront error of the Fizeau interferometer IF itself can be measured.

To improve the measurement accuracy, the wavefront of the projection optical system PL is preferably measured using a fringe scan method. Fringe scan can be performed by modulating the phase of the wavefront by driving the wafer stage 8 in the Z direction to move the spherical mirror 22 by approximately the wavelength of light in the Z direction. A mechanism for moving the spherical mirror 22 in the Z direction can use a moving mechanism to focus the projection optical system PL. Fringe scan can be performed even by modulating the phase of the wavefront by driving the reticle stage 5 in the Z direction to move the Fizeau surface 17a by approximately the wavelength of light in the optical axis direction.

Measuring the wavefront of the projection optical system PL makes it possible to obtain information associated with wavefront aberration at a measurement point. In wavefront measurement, the X, Y, and Z coordinates of the objective lens 16 and spherical mirror 22 obtained by the laser interferometer 31 may be used. Also, a rotational asymmetrical component and rotational symmetrical component of wavefront aberration obtained by measuring the wavefront of the projection optical system PL may be used. This makes it possible to calculate curvature of field and distortion that indicate the correlation among a plurality of measurement points of the projection optical system PL.

The curvature of field of the projection optical system PL can be calculated by measuring the wavefront of the projection optical system PL at a plurality of points in its field of view. That is, the curvature of field can be calculated on the basis of information about a plurality of points by detecting the coordinate position of the objective lens 16 in wavefront measurement, the wavefront of the projection optical system PL measured by the Fizeau interferometer IF, and the coordinate position of the spherical mirror 22 in the optical axis direction of the projection optical system PL. An especially important wavefront aberration component in curvature of field calculation is a rotationally symmetrical power component (defocus component) of the measured wavefront.

Distortion of the projection optical system PL can also be calculated by measuring the wavefront of the projection optical system PL at a plurality of points in its field of view. That is, distortion of the projection optical system can be calculated on the basis of information about a plurality of points by detecting the coordinate position of the objective lens 16 in wavefront measurement, the wavefront of the projection optical system PL measured by the Fizeau interferometer IF, and the coordinate position of the spherical mirror 22 in a direction perpendicular to the optical axis direction of the projection optical system PL. An especially important wavefront aberration component in distortion calculation is a rotationally asymmetrical component (tilt component) of the measured wavefront.

Driving all or some of the lenses in the projection optical system PL on the basis of the above-described measurement results makes it possible to adjust and control the aberration of the projection optical system PL to a desired state.

Instead of using the dedicated measurement light source 9, a light beam may be extracted from the optical path between the exposure light source 1 and the incoherent unit 3 and guided to the Fizeau interferometer IF. In the example shown in FIG. 3, a switching mirror 26 extracts a light beam from the optical path between the exposure light source 1 and the incoherent unit 3 and an extension optical system 25 guides it to the Fizeau interferometer IF.

Figure 3:
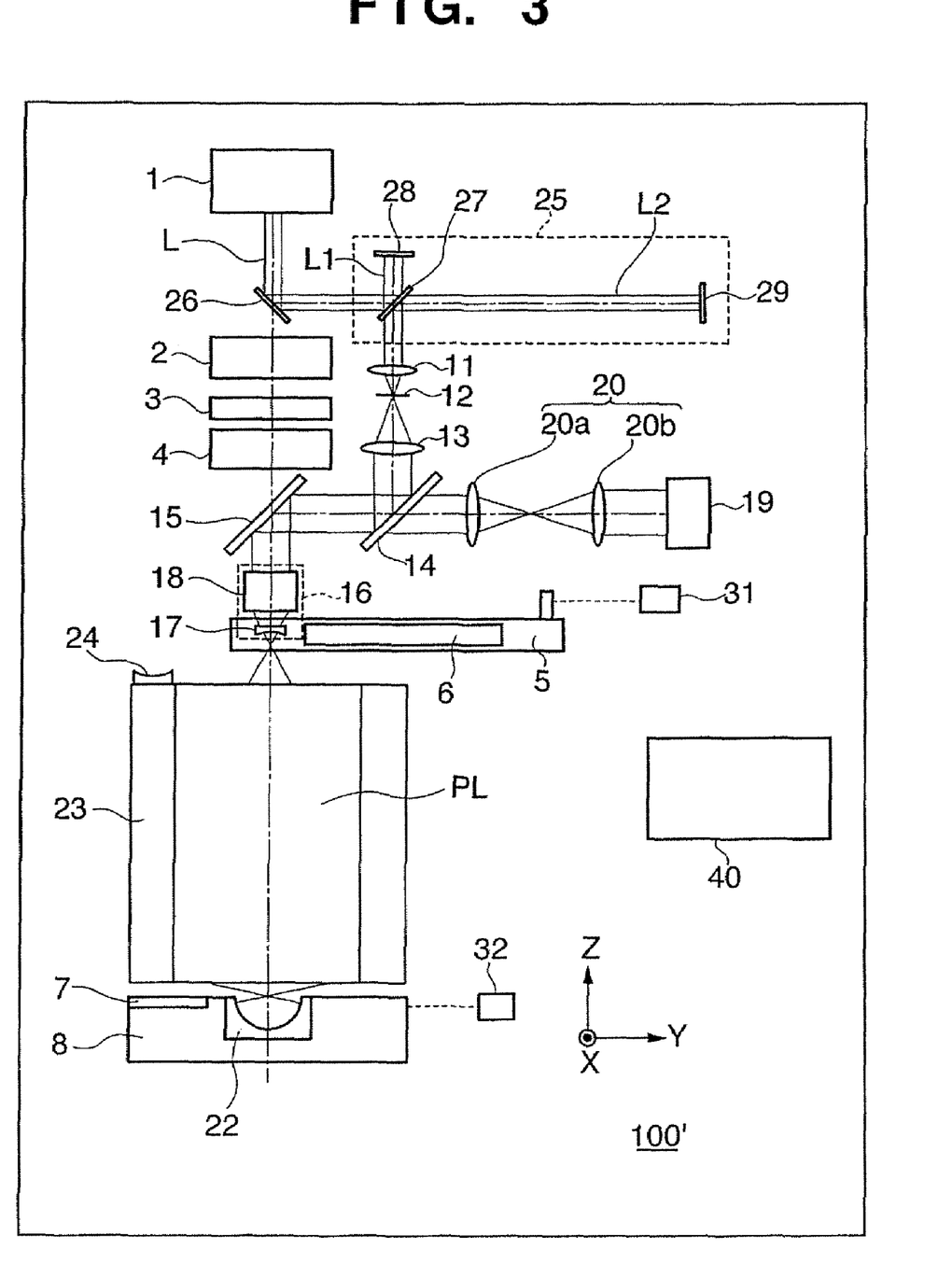
FIG. 3 is a view showing the schematic arrangement of a projection exposure apparatus according to another modification to the first embodiment of the present invention.

A light beam L emitted by the exposure light source 1 is reflected by the switching mirror 26 and guided to the extension optical system 25. The switching mirror 26 is driven by a driving unit, retreats from the optical path to illuminate the reticle 6 in exposing the wafer 7, and is inserted in the optical path in measuring the projection optical system PL. A beam splitter 27 splits the light beam L having reached the extension optical system 25 into a light beam L1 that travels toward a mirror 28 and a light beam L2 that travels toward a mirror 29. The light beams L1 and L2 return to the beam splitter 27 after being reflected by the mirrors 28 and 29, respectively. The distance between the beam splitter 27 and the mirror 29 is longer than that between the beam splitter 27 and the mirror 28 by an optical path length D between the Fizeau surface 17a and the spherical mirror 22. Both the light beam L1 transmitted through the beam splitter 27 and the light beam L2 reflected by it travel toward the condenser lens 11. The light beam L1 leads the light beam L2 by an optical path length 2D. The two light beams are condensed at the pinhole 12 by the condenser lens 11 and collimated into collimated beams by the collimator lens 13 again. The diameter of the pinhole 12 is set less than or equal to that of an airy disk determined by the numerical aperture of the collimator lens 13. For this reason, the light beam emerged from the pinhole 12 becomes an ideal spherical wave. This makes it possible to eliminate the wavefront difference between the light beams L1 and L2, which is caused by the extension optical system 25.

After being collimated into collimated beams by the collimator lens 13, the two light beams enter the objective lens 16 via the half mirror 14 and mirror 15. A component of the light beam L1 or L2 turns into a light beam L1r or L2r upon being reflected by the Fizeau surface 17a, and guided to the image sensor 19 via the mirror 15, half mirror 14, and pupil imaging system 20. The other component of the light beam L1 or L2 turns into a light beam L1t or L2t upon being transmitted through the Fizeau surface 17a, passes through the projection optical system PL, is reflected by the spherical mirror 22, passes through the projection optical system PL, and is guided to the image sensor 19 via the objective lens 16, mirror 15, half mirror 14, and pupil imaging system 20.

Of the two light beams L1r and L2r reflected by the Fizeau surface 17a, the light beam L2r has propagated through a long optical path in the extension optical system 25. Of the two light beams L1t and L2t reflected by the spherical mirror 22, the light beam L1t has propagated through a short optical path in the extension optical system 25. A projection exposure apparatus 100' is designed such that the optical path length difference between the light beams L2r and L1t falls within a coherence length ΔL of light emitted by the exposure light source 1. Since the two light beams L2r and L1t can interfere with each other, it is possible to measure the wavefront aberration of the projection optical system PL. When the optical path length difference 2D in the extension optical system 25 is greater than or equal to the coherence length ΔL, interference between light beams other than those described above never adversely affects wavefront aberration measurement. Assume that the two light beams acquire different wavefront aberrations in the extension optical system 25. Even in this case, when the two light beams pass through the pinhole 12 before striking the Fizeau surface, they pass through the pinhole 12 before striking the Fizeau surface to acquire the same wavefront, and hence never degrade the accuracy of wavefront aberration measurement.

Even using the exposure light source 1, the extension optical system 25 can form interference fringes between a reference light beam reflected by the Fizeau surface on the image sensing plane of the image sensor 19 and a test light beam that has passed through the projection optical system PL and is reflected by the spherical mirror 22. This makes it possible to measure the wavefront aberration of the projection optical system PL.

Figure 4A:
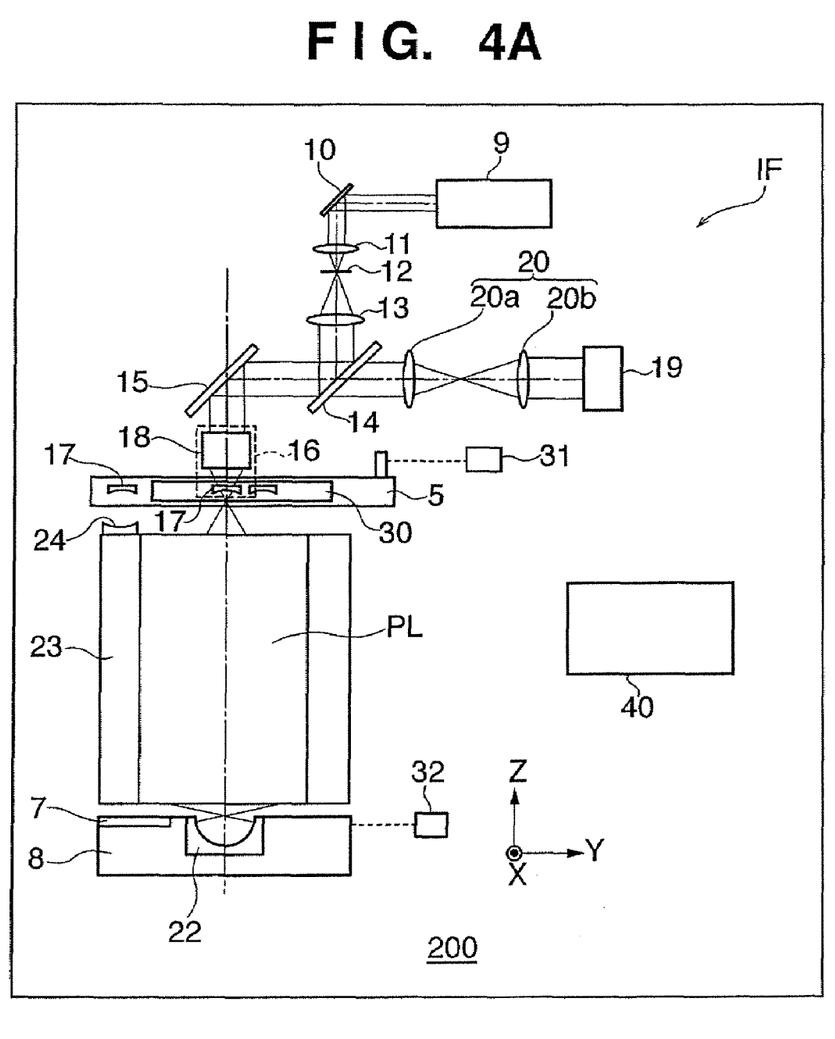
FIGS. 4A and 4B are views showing the schematic arrangement of a projection exposure apparatus according to the second embodiment of the present invention.
Figure 4B:
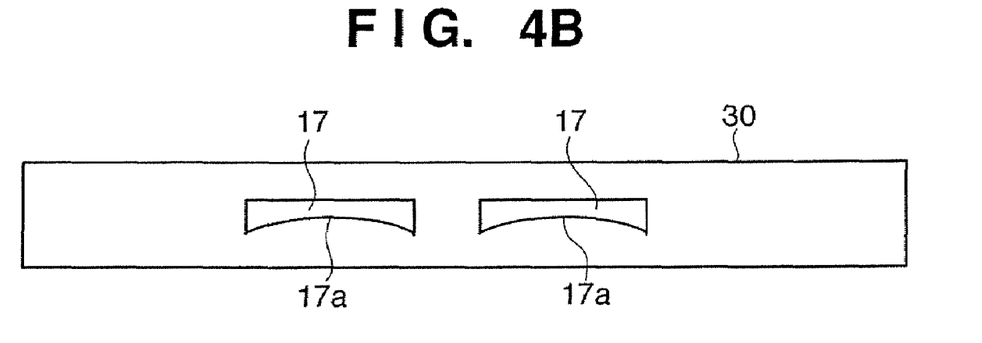

FIGS. 4A and 4B are views showing the schematic arrangement of a projection exposure apparatus according to the second embodiment of the present invention. Only differences between the first and second embodiments according to the present invention will be explained here. The basic arrangement of a Fizeau interferometer IF and the arrangement of a measurement light source 9 or extension optical system 25 can follow the first embodiment.

Figure 5:
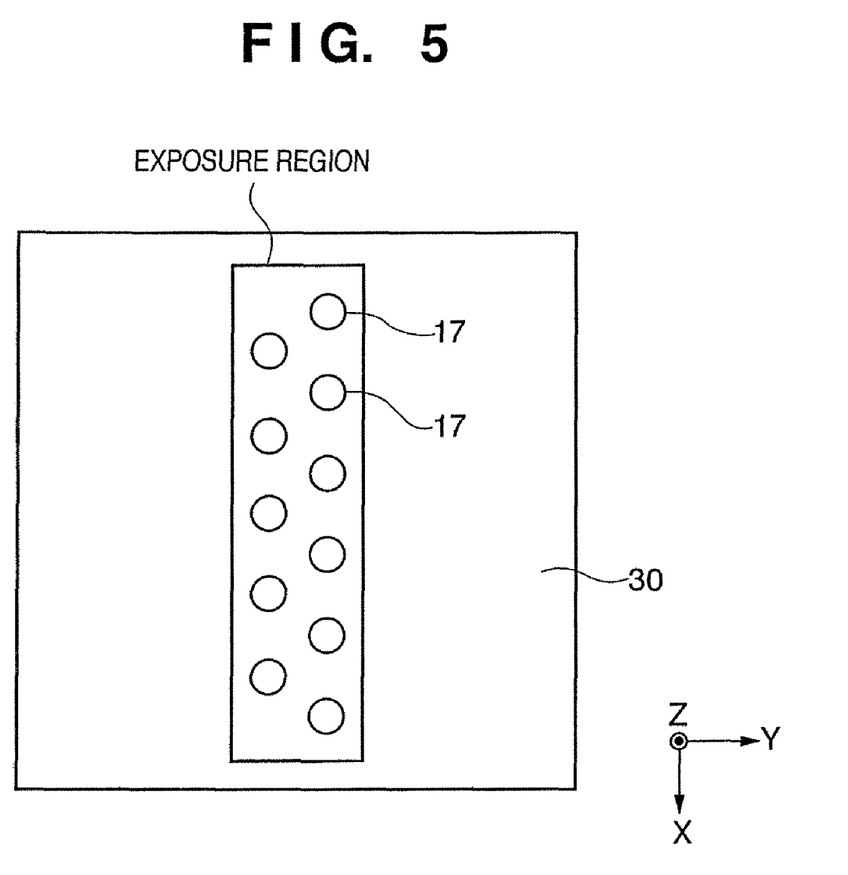
FIG. 5 is a view showing the schematic arrangement of an optical member according to the second embodiment of the present invention.

In this embodiment, an optical member 30 having a front objective lens group 17 including a Fizeau surface 17a is detachably arranged on a reticle stage 5 by taking advantage of synchronous control between the reticle stage 5 and a wafer stage 8 with a precision as high as, for example, nanometer order. Since the Fizeau surface 17a that influences the measurement accuracy is precisely positioned, it is possible to accurately measure the wavefront aberration of a projection optical system PL. One or a plurality of front objective lens groups 17 may be accommodated in the optical member 30. For example, as shown in FIG. 5, a plurality of front objective lens groups 17 are located at predetermined positions in an exposure region and combined with a rear objective lens group 18 which can be driven in the X and Y directions. This makes it possible to measure the wavefront aberration of the projection optical system PL at a plurality of image heights. Alternatively, the optical member 30 may be mounted on the reticle stage 5 having the front objective lens group 17 described in the first embodiment to measure wavefront aberration.

According to the second embodiment, it is possible to measure the wavefront aberration of the projection optical system PL at a plurality of image heights even when a plurality of front objective lens groups 17 cannot be mounted on the reticle stage 5 owing to spatial restrictions of the projection exposure apparatus. The optical member 30 having the plurality of front objective lens groups 17 is fixed on the reticle stage 5 in measuring the wavefront aberration of the projection optical system PL in place of a reticle 6.

Also according to the second embodiment, only the rear objective lens group 18 may be driven to the position of the front objective lens group 17 to be used even when the wavefront aberration of the projection optical system PL is measured at a plurality of image heights. Hence, the projection exposure apparatus according to the second embodiment can improve the optical axis adjustment precision and shorten the adjustment time.

In an arrangement shown in FIGS. 4A and 4B, of constituent lenses of an objective lens 16, only the front objective lens group 17 including the Fizeau surface is accommodated in the optical member 30. However, as illustrated in FIG. 6, the entire objective lens 16 may be accommodated in the optical member 30.

Figure 6:
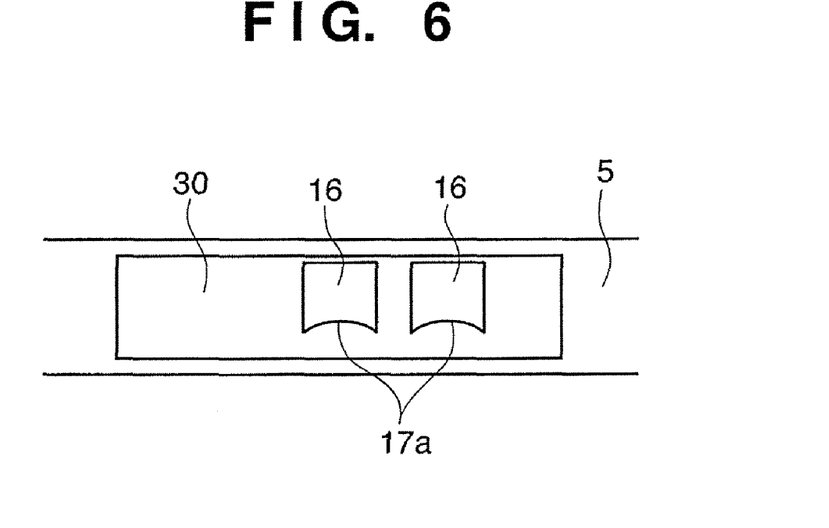
FIG. 6 is a view showing the schematic arrangement of an optical member according to a modification to the second embodiment of the present invention.

Also in an arrangement shown in FIG. 6, if the reticle stage 5 is driven only in the Y direction, a plurality of objective lenses 16 are preferably accommodated in the optical member 30 along the X direction. This makes it possible to measure the wavefront aberration of the projection optical system PL at a plurality of portions in its exposure region.

A plurality of projection exposure apparatuses can share one optical member 30. Alternatively, one projection optical system may have one optical member 30.

Figure 7:
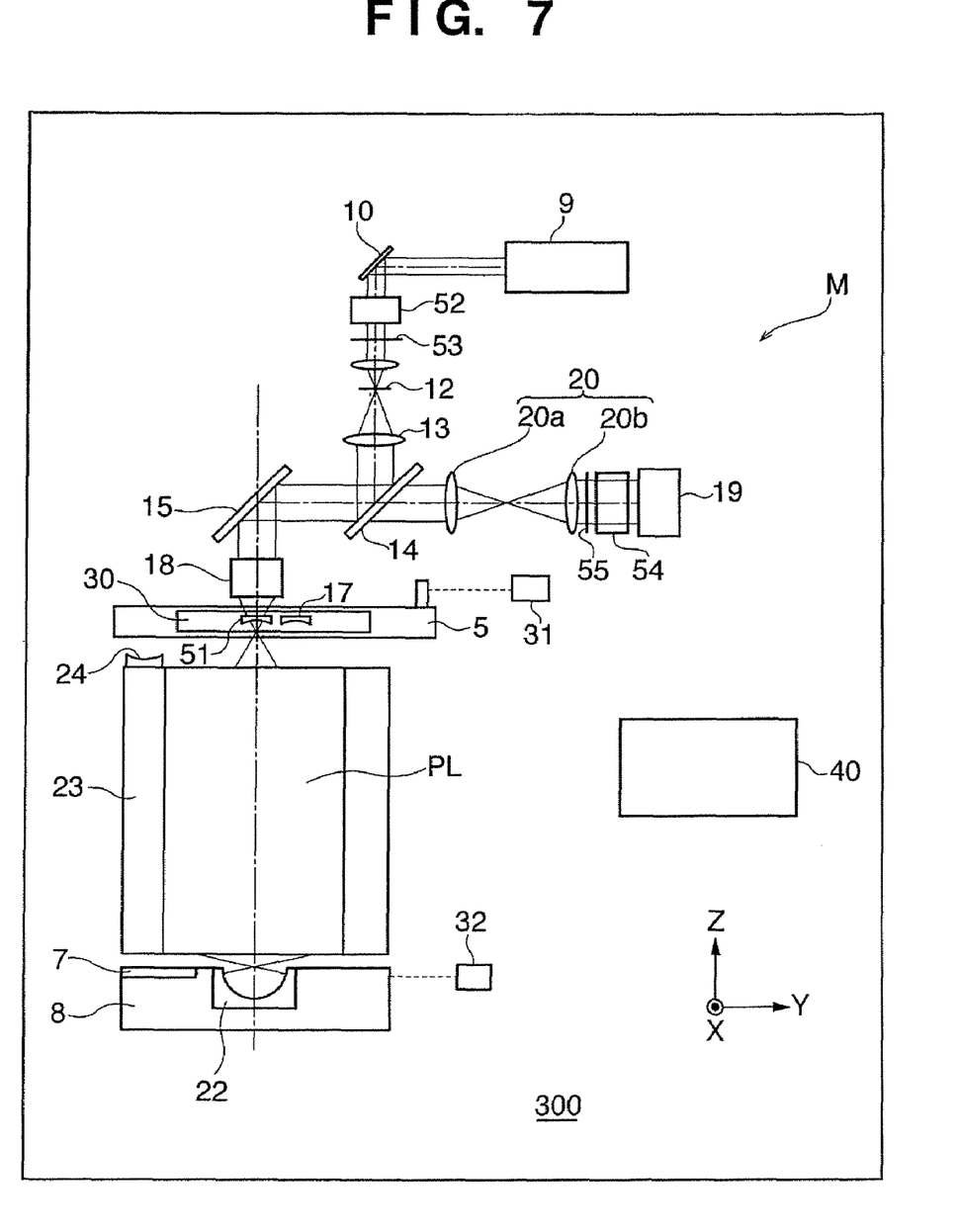
FIG. 7 is a view showing the schematic arrangement of a projection exposure apparatus according to the third embodiment of the present invention.

FIG. 7 is a view showing the schematic arrangement of a projection exposure apparatus according to the third embodiment of the present invention. A projection exposure apparatus 300 according to the third embodiment comprises a Fizeau interferometer for measuring the wavefront aberration of a projection optical system PL, and a measurement unit M including a measurement device for measuring the polarization characteristic matrix of the projection optical system PL.

The projection exposure apparatus 300 according to the third embodiment has a front objective lens group (second lens) 51 mounted on a reticle stage 5, in addition to or in place of a front objective lens group (first lens) 17 to constitute a Fizeau interferometer. The front objective lens group 51 is used to measure the polarization characteristic matrix of the projection optical system PL.

In measuring the polarization characteristic matrix of the projection optical system PL, no Fizeau surface to form a reference light beam is necessary. For this reason, the front objective lens group 51 has the same thickness and curvature radius as those of the front objective lens group 17 for wavefront aberration measurement, but has a surface which corresponds to a Fizeau surface and is coated with an antireflection coating. To use a common rear objective lens group 18 for measuring the wavefront aberration of the projection optical system PL and measuring a polarization characteristic matrix, at least one of the front objective lens groups 17 and 51 is mounted on at least one of the reticle stage 5 and an optical member 30. The front objective lens group 17 includes a first lens having a Fizeau surface which opposes the projection optical system PL and is not coated with any antireflection coating. The front objective lens group 51 includes a second lens having a surface which opposes the projection optical system PL and is coated with an antireflection coating. If the rear objective lens group 18 is driven onto the optical axis of the front objective lens group 17, the wavefront aberration of the projection optical system PL can be measured. If the rear objective lens group 18 is driven onto the optical axis of the front objective lens group 51, the polarization characteristic matrix of the projection optical system PL can be measured.

In measuring the wavefront aberration of the projection optical system PL, an optical member 30 having only the front objective lens group 17 may be used. In measuring the polarization characteristic matrix of the projection optical system PL, an optical member 30 having only the front objective lens group 51 may be used.

Although a measurement light source 9 dedicated to measurement is used in an arrangement shown in FIG. 7, an extension optical system 25 as described above may be used instead to obtain a measurement light beam. With this arrangement, it suffices to shield one of light beams L1 and L2 in the extension optical system 25 to measure a polarization characteristic matrix. In measuring only a polarization characteristic matrix, an exposure light source 1 may be used as the light source, and the measurement light source 9 or extension optical system 25 need not be used or prepared in advance.

As shown in FIG. 7, in the third embodiment, a polarizer 52 and wavelength plate 53 are added to an illumination unit of a wavefront aberration measurement optical system on the side of the measurement light source 9, while an analyzer 54 and wavelength plate 55 are added to the side of an image sensor 19.

Each of the polarizer 52 and wavelength plate 53 is fixed to a rotary stage (not shown). Changing the combination of the polarizer 52 and wavelength plate 53 can change a light beam emitted by the measurement light source 9 to a desired polarization state and guide it to the projection optical system PL. Hence, the polarizer 52, the wavelength plate 53, and the rotary stage which selects them form a changing unit for changing the polarization state of a light beam guided to the projection optical system PL.

The polarizer 52 can be used for the measurement light source 9. An example of the polarizer 52 is a lotion prism made of magnesium fluoride ($MgF_2$). The wavelength plate 53 can, for example, be a $\lambda/2$ plate or $\lambda/4$ plate. If the polarizer 52 alone can change a light beam emitted by the measurement light source 9 into a polarization state necessary for measuring the polarization characteristic matrix of the projection optical system PL, the wavelength plate 53 need not be provided.

The wavelength plate 55 is fixed to a rotary stage (not shown) and can give a predetermined phase delay amount to a test light beam transmitted through a pupil imaging system 20. The wavelength plate 55 can use not only a $\lambda/4$ plate but also a wavelength plate other than the $\lambda/4$ plate as long as it has a known phase delay amount and is not a $\lambda/2$ plate. Like the polarizer 52, the analyzer 54 uses a lotion prism.

The polarization characteristic matrix of the projection optical system PL can be measured in the following way. That is, the polarizer 52 and wavelength plate 53 guide a light beam in a desired polarization state to the projection optical system PL. Then, the image sensor 19 senses a change in the amount of light beam that has reciprocated the projection optical system PL while rotating the wavelength plate 55. The polarization characteristic matrix of the projection optical system PL may be calculated on the basis of the measurement result obtained in the above-described way and the polarization characteristic matrix of the Fizeau interferometer calculated in advance. It is also possible to measure the wavefront aberration of the projection optical system PL using light with desired polarization.

In measuring the wavefront aberration of the projection optical system PL using light with desired polarization, it suffices to use the front objective lens group 17 as the objective lens and use the measurement light source 9 as the light source, or to use the combination of the exposure light source 1 and extension optical system 25. The use of the polarizer 52 and wavelength plate 53 can generate desired polarization. This makes it possible to measure the wavefront aberration of the projection optical system PL using light with desired polarization by the same measurement method as in the first embodiment.

The transmittance distribution on the pupil plane of the projection optical system PL can also be measured on the basis of the transmittance distribution of the Fizeau interferometer itself measured using the spherical mirror 24, and that of a light beam having passed through the Fizeau interferometer and projection optical system PL. In addition, the use of the polarization characteristic matrix of the projection optical system PL and that of the Fizeau interferometer itself calculated in advance allows measurement of the transmittance distribution on the pupil plane of the projection optical system PL using light with desired polarization.

As described above, an optical system including a Fizeau surface which forms a reference light beam in a Fizeau interferometer is mounted on a reticle stage. Since the Fizeau surface is precisely positioned, it is possible to accurately measure the wavefront aberration of a projection optical system.

A projection exposure apparatus which incorporates a Fizeau interferometer can measure the characteristics (e.g., wavefront aberration) of a projection optical system. This makes it possible to rapidly take measures (e.g., the correction of the projection optical system or the stopping of an exposure operation) against a change in the characteristics of the projection optical system.

Figure 8:
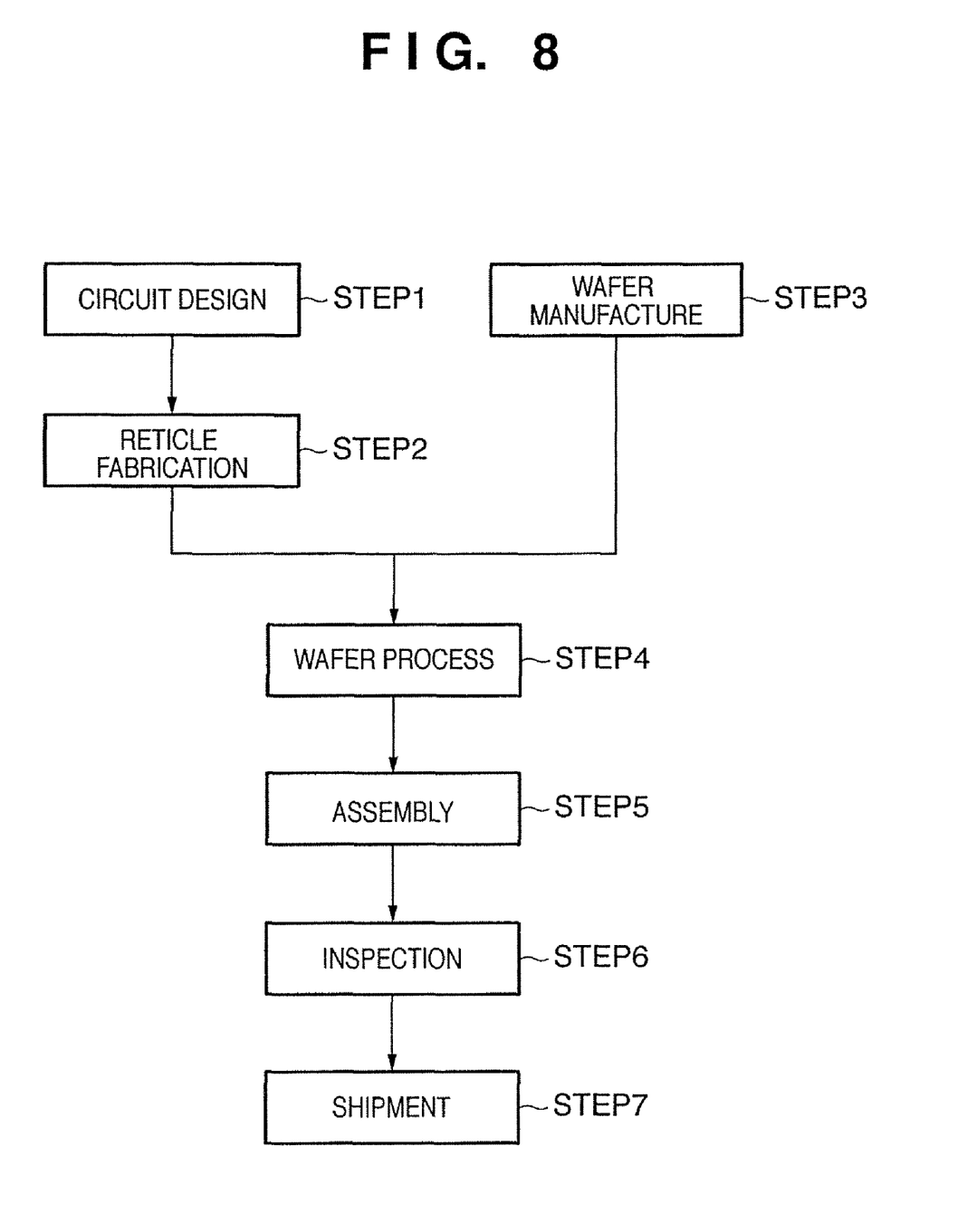
FIG. 8 is a flowchart illustrating the sequence of the overall semiconductor device manufacturing process.

A device manufacturing method using the above-described exposure apparatus will be explained next. FIG. 8 is a flowchart illustrating the sequence of the overall semiconductor device manufacturing method. In step 1 (circuit design), the circuit of a semiconductor device is designed. In step 2 (reticle fabrication), a reticle is fabricated on the basis of the designed circuit pattern. In step 3 (wafer manufacture), a wafer is manufactured using a material such as silicon. In step 4 (wafer process) called a preprocess, an actual circuit is formed on the wafer by lithography using the reticle and wafer. In step 5 (assembly) called a post-process, a semiconductor chip is formed using the wafer manufactured in step 4. This step includes processes such as assembly (dicing and bonding) and packaging (chip encapsulation). In step 6 (inspection), inspections including operation check test and durability test of the semiconductor device manufactured in step 5 are performed. A semiconductor device is completed with these processes and shipped in step 7.

Figure 9:
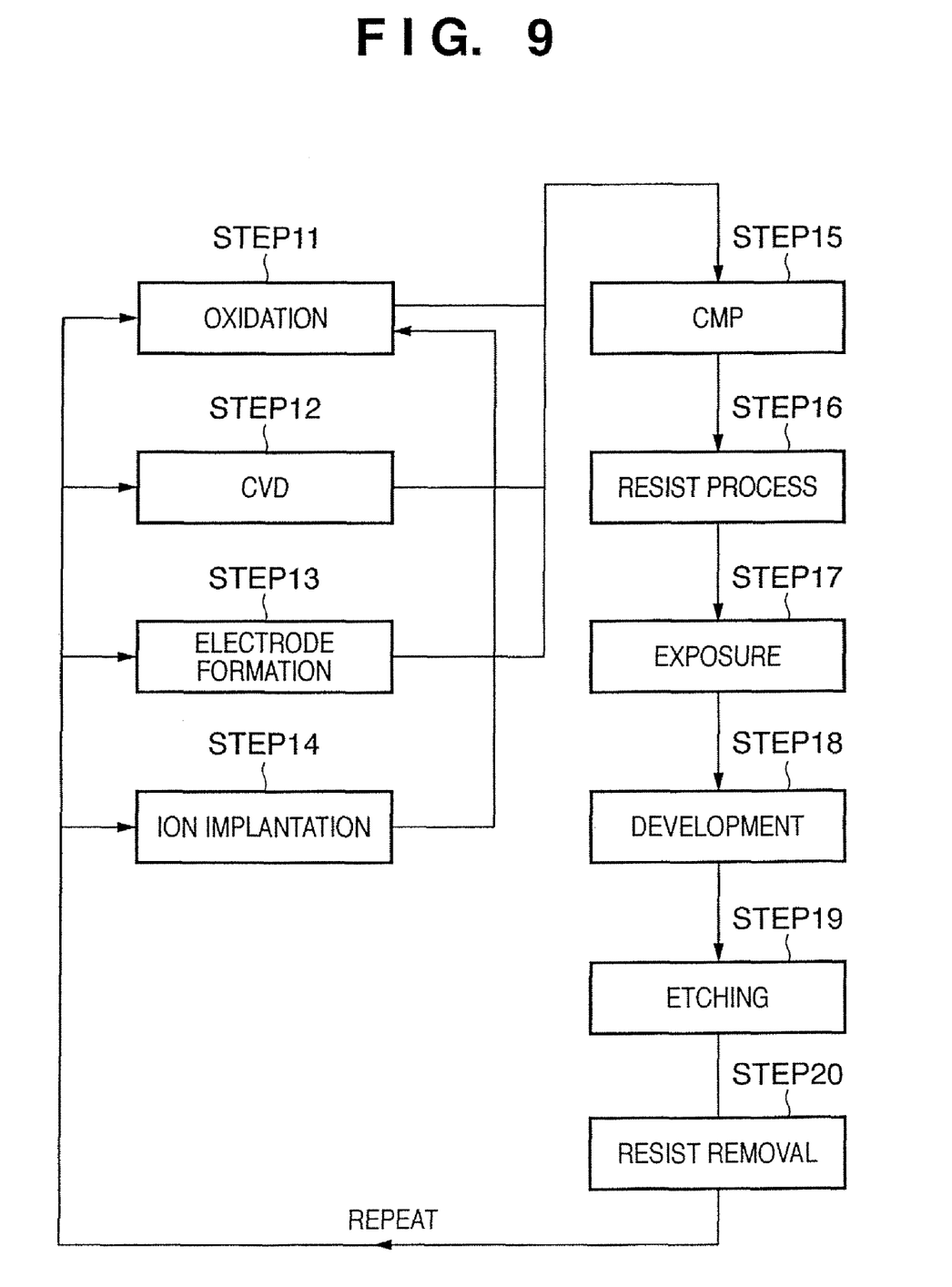
FIG. 9 is a flowchart illustrating the detailed sequence of the wafer process.

FIG. 9 is a flowchart illustrating the detailed sequence of the wafer process. In step 11 (oxidation), the wafer surface is oxidized. In step 12 (CVD), an insulating film is formed on the wafer surface. In step 13 (electrode formation), an electrode is formed on the wafer by deposition. In step 14 (ion implantation), ions are implanted into the wafer. In step 15 (CMP), the insulating film is planarized by CMP. In step 16 (resist process), a photosensitive agent is applied to the wafer. In step 17 (exposure), the above-described exposure apparatus is used to form a latent image pattern on the resist by exposing the wafer coated with the photosensitive agent to light via the mask on which the circuit pattern is formed. In step 18 (development), the latent image pattern formed on the resist on the wafer is developed to form a resist pattern. In step 19 (etching), the layer or substrate under the resist pattern is etched through a portion where the resist pattern opens. In step 20 (resist removal), any unnecessary resist remaining after etching is removed. By repeating these steps, a multilayered structure of circuit patterns is formed on the wafer.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-289201, filed Oct. 24, 2006, which is hereby incorporated by reference herein in its entirety.

What is claimed is:

1. A protection exposure apparatus comprising:
    a protection optical system configured to project a pattern image of an original onto a substrate;
    an original stage configured to hold the original;
    a substrate stage configured to hold the substrate; and
    a measurement unit,
    wherein said measurement unit includes a Fizeau interferometer including a first optical unit mounted on said original stage and a mirror mounted on said substrate stage, said first optical unit including a first lens having a Fizeau surface which is not coated with any antireflection coating and which is configured to split a light beam into a reference light beam and a test light beam, and said mirror being configured to reflect the test light beam having passed through said projection optical system, and
    wherein said measurement unit further comprises a second optical unit including a second lens which has a shape identical to a shape of said first lens and has a surface which opposes said projection optical system and is coated with an antireflection coating.

2. The apparatus according to claim 1, wherein an optical member including said first and second optical units is detachable from said original stage.

3. A device manufacturing method comprising the steps of:
    forming a latent image pattern on a photosensitive agent by exposing a substrate coated with the photosensitive agent to light using a projection exposure apparatus defined in claim 1; and
    developing the latent image pattern.

* * * * *